United States Patent [19]
Wilcox et al.

[11] Patent Number: 5,038,996
[45] Date of Patent: Aug. 13, 1991

[54] BONDING OF METALLIC SURFACES

[75] Inventors: James R. Wilcox, Vestal; Charles G. Woychik, Endicott, both of N.Y.

[73] Assignee: International Business Machines Corporation, Armonk, N.Y.

[21] Appl. No.: 382,073

[22] Filed: Jul. 17, 1989

Related U.S. Application Data

[63] Continuation of Ser. No. 256,534, Oct. 12, 1988, abandoned.

[51] Int. Cl.$^5$ .................. B23K 1/19; B23K 101/36; H05K 3/34
[52] U.S. Cl. .................. 228/121; 228/123; 228/195; 228/262
[58] Field of Search ............ 228/123, 122, 194, 195, 228/180.2, 263.18, 121, 262

[56] References Cited

U.S. PATENT DOCUMENTS

| | | | |
|---|---|---|---|
| 3,097,425 | 7/1963 | Kolenko et al. | 29/492 |
| 3,392,442 | 7/1968 | Napier et al. | 228/123 |
| 3,417,461 | 12/1968 | Wells et al. | 29/487 |
| 3,496,630 | 2/1970 | Duff et al. | 29/487 |
| 3,675,310 | 7/1972 | Schwaneke et al. | 29/492 |
| 3,702,500 | 11/1972 | Gorinas et al. | 29/628 |
| 3,744,121 | 7/1973 | Nagano et al. | 228/123 |
| 3,839,727 | 10/1974 | Herdzik et al. | 357/71 |
| 3,957,194 | 5/1976 | Woodward | 228/194 |
| 3,993,238 | 11/1976 | Brook et al. | 228/194 |
| 4,020,987 | 5/1977 | Hascoe | 228/123 |
| 4,034,906 | 7/1977 | Carlson et al. | 228/194 |
| 4,263,606 | 4/1981 | Yorikane | 357/71 |
| 4,332,341 | 6/1982 | Minetti | 228/180 |
| 4,727,633 | 3/1988 | Herrick | 228/180.2 |
| 4,767,471 | 8/1988 | McLellan | 148/24 |
| 4,875,617 | 10/1989 | Citowsky | 228/123 |

FOREIGN PATENT DOCUMENTS

| | | | |
|---|---|---|---|
| 2006737 | 1/1970 | France . | |
| 2460176 | 1/1981 | France . | |
| 72756 | 6/1978 | Japan | 228/194 |
| 124965 | 9/1980 | Japan | 228/123 |
| 59-154041 | 7/1982 | Japan | 21/92 |
| 57-106057 | 9/1984 | Japan | 21/92 |
| 1204052 | 9/1970 | United Kingdom . | |

OTHER PUBLICATIONS

Getazheev et al., "Estimating the Depth of the Diffusion Zone in the Solid Phases during Contact Melting of Eutectic Binary Systems under Transient Conditions", Kabardino-Balkar State University, No. 1, pp. 130-132, Jan. 1972.

Sakhno, "Composition of the Liquid Formed during Contact during Contact Fusion", Dneptropetrovsk State University, Fiz. Metal. Metalloved., 30, No. 1, 193-194, 1970.

Doklady, "The Formation of Dislocations in Metals on Diffusion of Surface-Active Substrates in Connection with the Effect of Adsorption Embrittlement", Soviet--Physics-Doklady, vol. 13, No. 6, Dec. 1970, pp. 614-617.

Savantsev et al., "Partial Diffusion Coefficients", Fiz. Metal. Metalloved., 26, No. 6, 1119-1121, 1968.

Savintsev et al., "Fusion of Alkali Halide Crystals on Contact with Surface-Active Organic Substrates", (List continued on next page.)

Primary Examiner—Sam Heinrich
Attorney, Agent, or Firm—Pollock, Vande Sande & Priddy

[57] ABSTRACT

Two metallic surfaces are bonded together by coating each of the metallic surfaces with a layer of a first material and a layer of a second and different material contacting the layer of the first material. The first material and second material are chosen so that a eutectic liquid layer will form at the interface between them. The layers of the second material on each of the metallic surfaces are abutted together and then the layers are heated above the eutectic temperatures to form a localized liquid, which upon solidification results in an interconnection between the surfaces.

15 Claims, 3 Drawing Sheets

OTHER PUBLICATIONS

Russian Journal of Physical Chemistry, vol. 40, No. 6, Jun. 1966, pp. 733–734.

Savintsev et al., "Effect of Fusible-Metal Deformation on Contact-Melting Kinetics", Kabardino-Balkarskii State University, No. 5, pp. 102–104, May 1979.

Savintsev et al., "Determining Diffusion Coefficients in Eutectic Fusions by the Contact Smelting Method", Kabardinian-Balkar State University, vol. 35, No. 2, pp. 195–196, Feb. 1969.

IBM Technical Disclosure Bulletin, "Method for Modified Solder Reflow Chip Joining", vol. 16, No. 9, Feb., 1974.

Welding Journal, "Brazing by the Diffusion-Controlled Formation of a Liquid Intermediate Phase", pp. 85–89, Feb. 1959.

Mechanical Engineering, "Diffusion Bonding", pp. 24–32, vol. 92, No. 5, May 1970.

Metals Handbook Ninth Edition, vol. 6, "Soldering", pp. 1069–1101, copyright 1983.

BONDING OF METALLIC SURFACES

This application is a continuation of Ser. No. 07/256,534 filed on Oct. 12, 1988, now abandoned.

DESCRIPTION

1. Technical Field

The present invention is concerned with a method for bonding metallic surfaces together and is especially concerned with a method that does not require flux. The method of the present invention is concerned with a process for bonding metallic surfaces whereby different metals of a eutectic system are deposited on the surfaces to be bonded and the metals are then contacted at a temperature above the eutectic temperature. The process of the present invention is especially suitable for bonding metallic terminals, such as copper terminals, on electronic components such as semiconductor chips, semiconductor chip carrying modules, surface mounted electronic devices, and the like, to copper pads on a second level electronic package such as a printed circuit board or a printed circuit card.

2. Background Art

In many products and applications it becomes necessary to bond two metallic surfaces together. For instance, in the fabrication of current day electronic devices, it is necessary to bond electrically conductive metallic bonding pads, such as copper bonding pads, together.

For instance, the copper terminals on an electronic component such as a semiconductor chip, a semiconductor chip carrying module, or a surface mounted electronic device needs to be bonded to a corresponding copper bonding pad on a second level electronic package such as a printed circuit board or a printed circuit card. The techniques generally employed are conventional surface soldering techniques which normally require that a solder or solder paste be provided in the desired locations for bonding as well as providing solder flux for the soldering operation. In addition, the use of conventional soldering techniques are undesirable because of the potential for solder bridging between closely spaced adjacent pads (i.e., electrical shorting of two adjacent pads with solder).

More recently a technique for bonding two metallic surfaces together referred to as "transient liquid phase" has been suggested. In particular, "transient liquid phase bonding" involves depositing different metals of a eutectic system on the metallic surfaces to be bonded. These depositions are contacted at a temperature above the eutectic temperature. Interdiffusion between the two eutectic components produces a thin, liquid layer that has a composition range which corresponds to the liquid phase region of the eutectic phase diagram. Solidification of this thin, liquid region bonds the metallic surfaces together.

As compared to conventional surface soldering techniques, a transient liquid phase bonding process has several advantages such as confining the liquid metal phase region to the contacting area of the mating substrates. Also, the minimum spacing between substrates is not restricted by the resolution of a solder paste screening process or by concerns of solder bridging. This, in turn, makes it possible to provide for much greater area densities of contacted metal surfaces.

An especially significant problem exists with bonding of copper surfaces together with lead-tin solders in that the formation of excessive copper-tin intermetallics tends to adversely affect the mechanical strength of the bonds. With respect to a transient liquid phase bonding technique, solidifying the liquid zone before it reaches the copper would avoid this formation of excessive intermetallic compounds and, thus, provide for improved mechanical strength of the bond.

Notwithstanding the numerous advantages achievable by employing a transient liquid phase bonding technique, there exist certain difficulties with respect to adequately implementing the process. For instance, the surfaces to be bonded must be in intimate contact with each other, which requires smooth, planar oxide-free surfaces in order to provide the necessary metal-to-metal contact at all points. For instance, components that are not bonded shortly after deposition of the metal will form an oxide layer which may then act as a barrier to diffusion and thereby prevent the desired bonding. This illustrates the need for time constraints on the storage of coated metallic substrates that are to be bonded prior to the bonding procedure and/or the need for removal of oxide layers.

In order to compensate for inevitable surface roughness, the suggested transient liquid phase bonding must be conducted under an applied pressure to assure that the surfaces to be bonded have the necessary intimate contact. Thus, such a bonding technique is restricted to those components in which the bonding surfaces can be compressed and it precludes the use of leadless components, unless the component itself can withstand the bonding pressure.

Also, since the initial liquid zone forms at a very rapid rate during the bonding, controlled solidification is very difficult to properly effect. For instance, with conventional heating or reflow procedures, the liquid zone generally consumes both coating layers on the metallic substrates.

SUMMARY OF THE INVENTION

The present invention is concerned with a process for bonding two metallic surfaces together which can be carried out without flux, without the formation of excessive intermetallic phases, and reducing the possibility of solder bridging.

In particular, the process of the present invention is concerned with an improved "transient liquid phase bonding" process.

The present invention overcomes both the above-discussed problems with respect to normal transient liquid phase bonding techniques while, at the same time, retaining the advantages of such a technique over conventional surface soldering.

In particular, the present invention is concerned with bonding two metallic surfaces together by coating each of the metallic surfaces with a layer of a first material followed by a layer of a second and different material. The second and different material contacts the layer of the first material and the first material and second and different material must be from a binary system (binary system refers to employing pure metals and/or alloys) containing a eutectic reaction such as Pb-Sn or Sn-Bi. The layers of the second and different material of each of the metallic substrates are abutted together and then the layers are heated above the eutectic temperature of the materials to form a localized liquid, which upon solidification, results in an interconnection between two surfaces.

BEST AND VARIOUS MODES FOR CARRYING OUT THE INVENTION

The method of the present invention is especially applicable to bonding those metallic substrates which normally require a soldering technique and especially metallic surfaces employed in high-quality electronic devices such as copper surfaces including copper bonding pads in, for example, mounting electronic components, such as flexible thin film carriers, to printed circuit cards or boards.

Figure 1A:
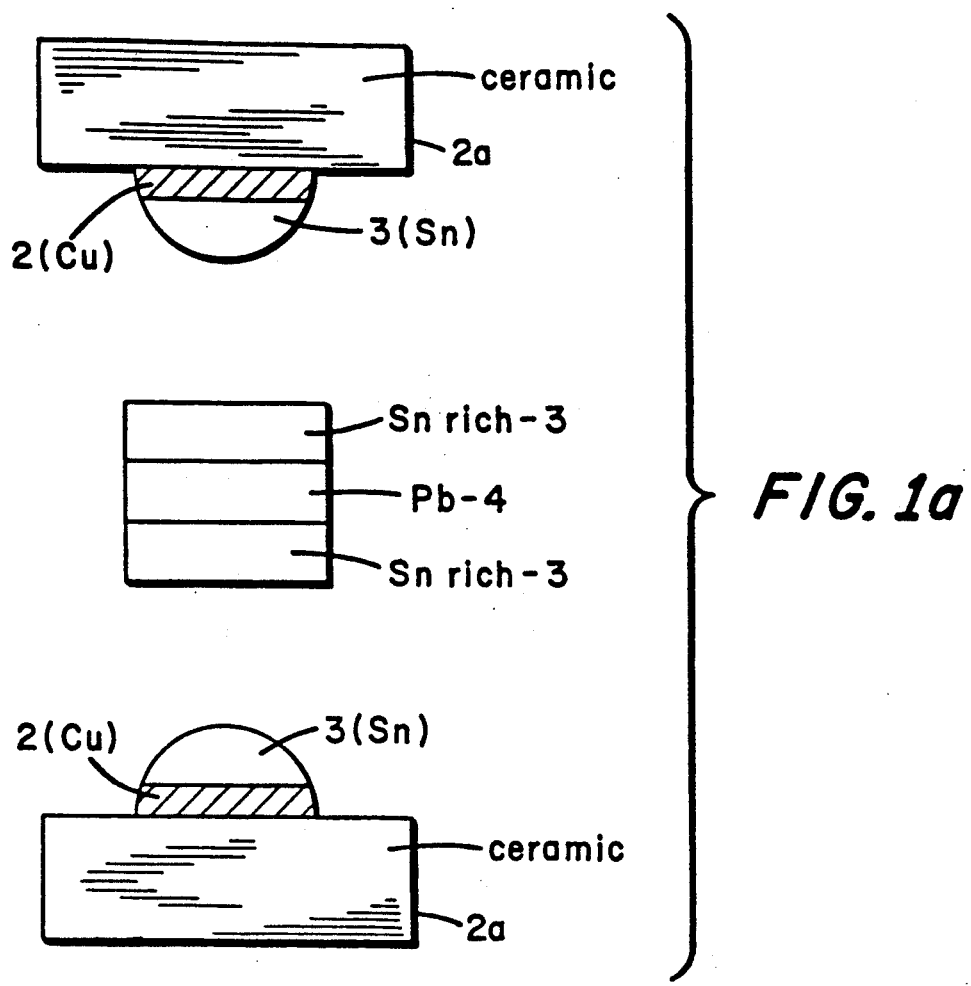
FIG. 1a schematically illustrates the use of an Sn-coated top (on Pb-rich) insert layer sandwiched between two Sn-coated copper surface pads in accordance with the present invention.
Figure 1B:
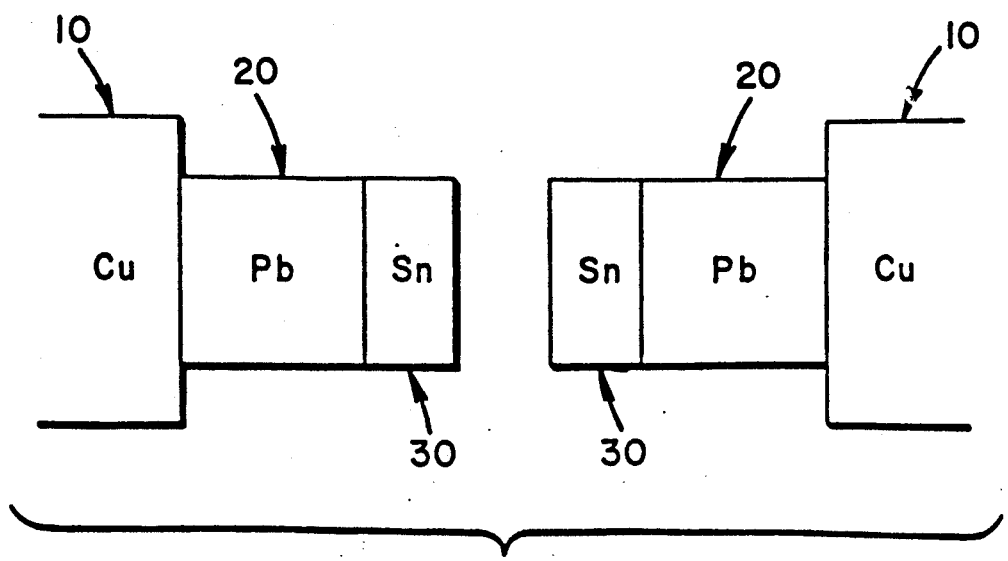
FIG. 1b schematically illustrates a multi-layer structure on each of the mating surfaces in accordance with the present invention.
Figure 2:
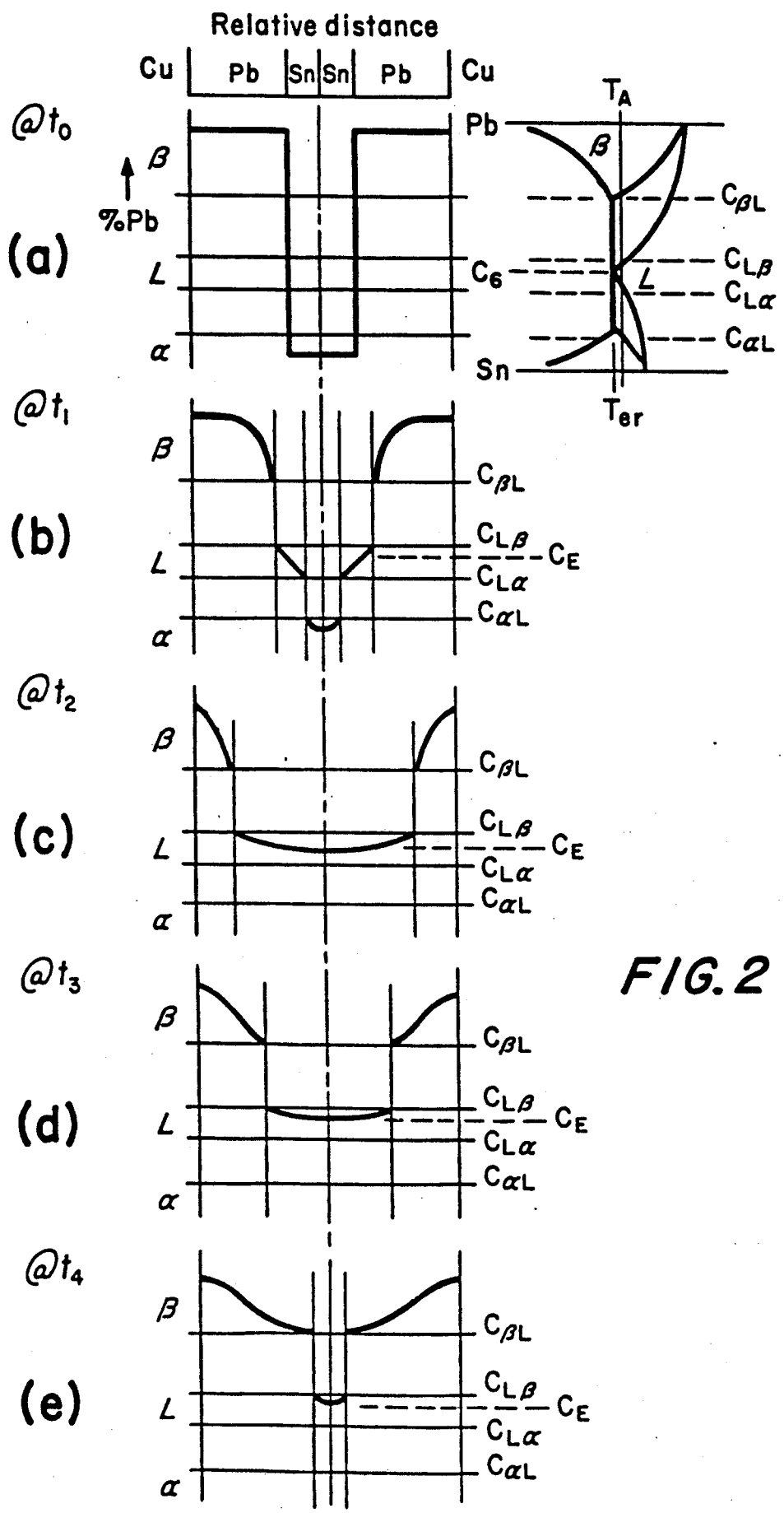
FIGS. 2a-2e schematically illustrate compositional and phase changes that occur during the bonding process for a representative eutectic system (Pb-Sn) employed in the method of the present invention.

In order to facilitate understanding of the present invention, reference is made to FIG. 1b and the use of lead and tin layers as preferred materials to form the eutectic. In particular, numeral 10 refers to the metallic substrate, such as copper, to be bonded. Deposited onto each of the layers (10) is a layer (20) of a first material such as Pb or a Pb-rich Pb-Sn alloy. Typical thicknesses of layer (20) are about 0.002" to about 0.010". Typically, this deposited layer is an alloy of Pb (2-5%)Sn.

Deposited on each layer (20) is a layer of a second and different material (30). In the preferred aspects of the present invention layer (30) is tin. The first material and the second and different material of the layers are chosen so that a eutectic liquid layer will form at the interface between both layers. Layer (30) is generally not as thick as layer (20) and is usually about 0.001" to about 0.002" thick. Typically, this layer (30) is pure Sn having a thickness of about 0.0015". Of course, these relative thicknesses depend on the eutectic composition of the particular system employed, keeping in mind that pure metals are not required; the composition of the deposits and the desired final composition. In the preferred embodiment of employing a tin layer deposited on a lead layer, the tin layer should be deposited immediately after the lead deposition before the lead can undergo significant oxidation.

The layers (30) of the second and different material on each of the metallic surfaces are abutted together and then the composite is heated to a temperature above the eutectic temperature. In the case of the lead-tin eutectic, a temperature of about 183.5° C. to about 210° C. is usually employed. Heating at these temperatures results in interdiffusion between the material of layer (30) and that of layer (20) beginning at both of the interfaces between layers (20) and (30). Interdiffusion between the exterior layers (30) is not required.

During bonding a small amount of pressure is applied to crack the surface Sn-oxide. As the material of layers (20) and (30) interdiffuse within each layer, the two liquid zones grow outward, thereby consuming the material in layer (30) which, in most cases, is Sn. Moreover, surface tension of the two liquid zones tends to pull the individual layers together (through the cracked Sn-oxide layer) and disperse the oxides throughout the molten zones. The use of either mechanical pressure and/or ultrasonic energy during the bonding process will enable any oxide layer, on the top surface of layers (30), to crack and allow the liquid to completely wet both of the bonding sites. The applied load can be as low as 7.8 gm/mm$^2$ per pad area.

Use of multiple layers of different materials pursuant to the present invention provides an advantage in that the materials and relative thicknesses of such can be selected so that the liquid zone is self-limiting. For instance, in the lead-tin system, the relative thickness of the tin layer can be such that complete homogenization of the two layers will produce a lead-rich alloy. As the liquid zone grows outward, the lead content of the liquid will increase and this lead enrichment will progress until the liquid composition is outside the eutectic liquid range. At this point, the liquid will then solidify. This is advantageous since the solidification can be accomplished before any of the liquid actually contacts the copper substrates, thereby preventing the formation of excessive copper-tin intermetallic phases.

The process of liquid phase formation and the resolidification can occur at a constant temperature or temperature range above the eutectic temperature. This temperature can be as low as 0.5° C. above the eutectic temperature as was found to be the case in the Sn-Pb system.

Reference to FIGS. 2a to 2e schematically illustrates the various compositional and phase changes that occurred during the isothermal bonding process. In particular, the percent lead is plotted as a function of distance for increasing time (t). The tin-rich and lead-rich phases are designated as $\alpha$ and $\beta$, respectively. The equilibrium compositions at the liquid-solid boundaries are determined by the bonding temperature ($T_B$) and the equilibrium phase diagram. The stable phase regions are labelled along the left side on the composition axis.

In particular, the initial condition ($t_0$) (see FIG. 2a) consists of lead-rich layers beneath the two contacting tin-rich layers. At time ($t_1$) (see FIG. 2b) interdiffusion has created two liquid zones at the lead/tin boundaries. These grow rapidly outward to consume the original bonding interface at time ($t_2$) (see FIG. 2c). The lead continues to diffuse into the liquid zone at time ($t_3$) (see FIG. 2d) making it unstable. The liquid zone continues to shrink at time ($t_4$) (see FIG. 2e) until complete solidification occurs.

Without further homogenization, the final composition profile will contain outer layers near the composition of the initial lead layer and an inner region near the solidus composition. All of the regions will be in the high fatigue-resistant, lead-rich composition range.

Although the above method has been described with specific reference to a lead-tin eutectic system, such is just as applicable to other eutectic systems such as tin-bismuth or tin-indium.

Furthermore, as discussed above, the present invention is especially beneficial in first level electronic packaging for attaching integrated circuit chips to integrated circuit chip carriers.

Figure 3:
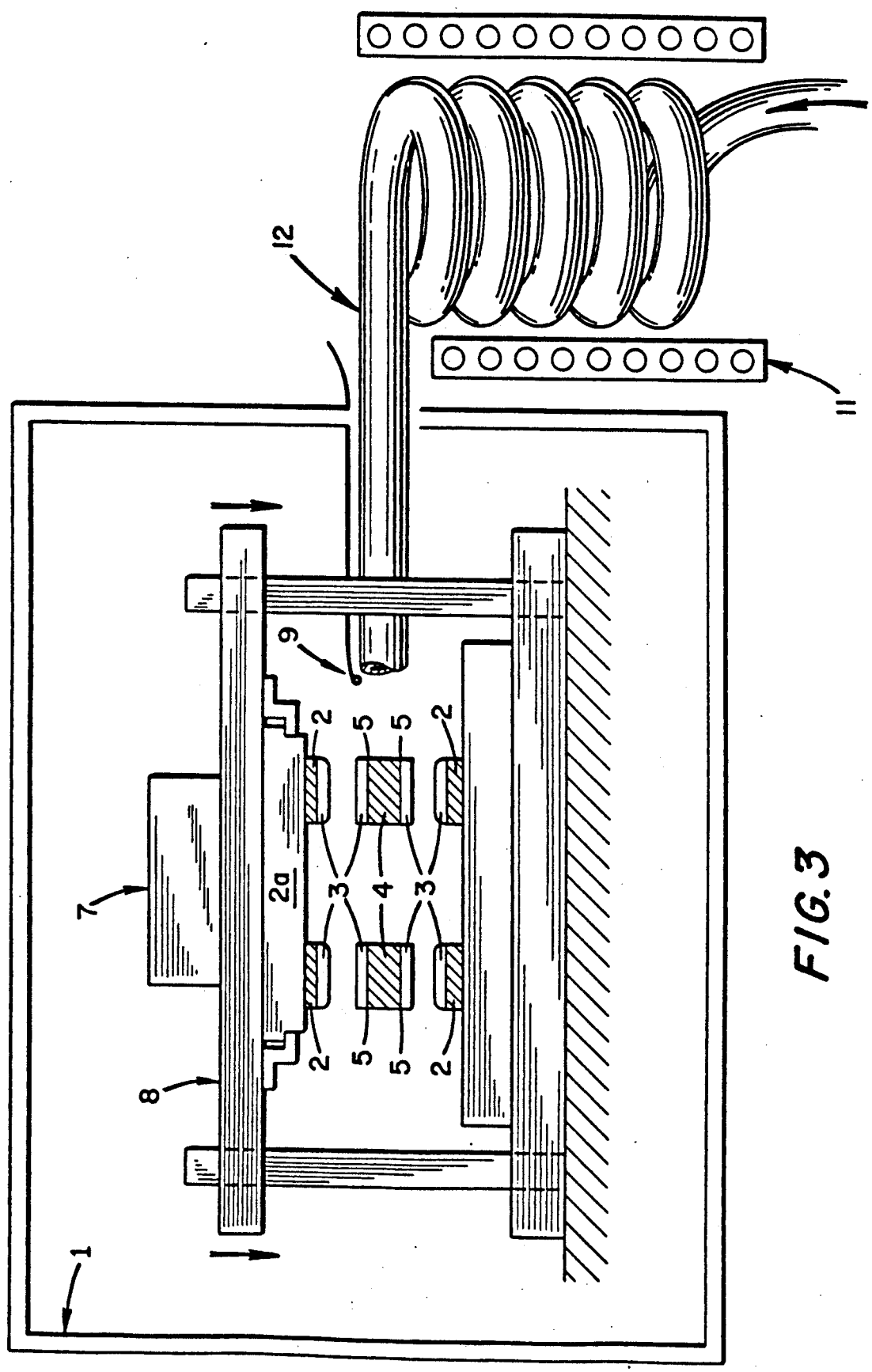
FIG. 3 is a schematic of apparatus suitable for carrying out the process of the present invention.

Reference to FIG. 3 shows a schematic of apparatus that can be used to carry out the process of the present invention. This Figure illustrates the use of a multilayered structure shown, for instance, in FIG. 1a. Numeral 1 represents a chamber that can be placed under vacuum. Numeral 2 refers to the metal structures such as copper on a ceramic substrate (2a) (see FIG. 1a) that are to be bonded together. Numerals 3 and 4 refer to the different layers such as tin and lead, respectively, that form the eutectic liquid layer at the interface 5 between them. Numeral 7 represents a weight to insure intimate contact between the abutting surfaces. Numeral 8 represents a holding device for maintaining the metal structures during the processing. Numeral 9 represents a thermocouple to determine the temperature of the gas flowing through conduit 12. Numeral 11 represents furnace means for heating the gas flowing through conduit 12. This apparatus can, of course, also be used to allow TLP bonding of an initial multilayered structure shown in FIG. 1b or any of the structures within the scope of the present invention.

The following non-limiting example is presented to further illustrate the present invention:

The multilayered structure illustrated in FIG. 3 wherein a tinned piece of lead is sandwiched between tin coated copper rods is subjected to an inert gas reflow method in apparatus of the type shown in FIG. 3. A force of about 10 psi (per pad area) (7) is used to insure intimate contact between the abutting surfaces. The thickness of the lead button (4) prior to tinning is about 0.5 mm thick. The tin coating (3) on the lead button and the copper rods is obtained by dipping in a molten tin bath. The chamber is evacuated to about 800 mm Hg. The structure can then be reflowed in an inert gas or a reducing atmosphere (argon+4% $H_2$) at a temperature ranging from 183.5° C. to the melting temperature of pure Sn.

Having thus described our invention, what we claim as new and desire to secure by Letters Patent is:

1. A method for bonding two metallic surfaces together which comprises:
    a) coating each of said metallic surfaces with a layer of a first material that contains lead and a layer of second and different material contacting said layer of said first material, said layer of second and different material containing tin; wherein the first material and second and different material are from a binary system containing a eutectic reaction; and wherein the thickness of said layer of second and different material containing tin is thinner than the thickness of said layer of said first material that contains lead;
    b) abutting the layer of the second and different material of each of said metallic surfaces together;
    c) then heating the layers above the eutectic temperature of the materials to thereby form a localized liquid which consumes the interface between the second and different materials, which then solidifies before formation of excessive metallic surface-tin intermetallic phases that would adversely affect the mechanical strength of interconnection between the surfaces, and resulting in an interconnection between the surfaces.

2. The method of claim 1 wherein said metallic surfaces are copper.

3. The method of claim 1 wherein said heating is to temperature of about 183.5° C. to a temperature slightly below the melting temperature of pure Sn.

4. The method of claim 3 wherein said metallic surfaces are copper.

5. The method of claim 1 wherein the thickness of said layer of a first material is about 0.002" to about 0.010" and the thickness of said second layer of a second and different material is about 0.001" to about 0.002".

6. The method of claim 1 wherein said metallic surfaces are copper; said first material is lead and said second material is tin.

7. The method of claim 1 where the layers are abutted under pressure to enhance the dispersion of interfacial Sn oxides.

8. The method of claim 1 where ultrasonic vibrations are supplied to the structure during reflow to enhance oxide dispersion.

9. The method of claim 1 wherein said heating is to about 183.5° C. to about 210° C.

10. The method of claim 1 wherein said first material is lead or a lead rich Pb-Sn alloy.

11. The method of claim 1 wherein said first material is an alloy of Pb-(2-5%)Sn.

12. The method of claim 11 wherein said metallic surfaces are copper and said second material is tin.

13. The method of claim 12 wherein said heating is to about 183.5° C. to about 210° C.

14. The method of claim 1 wherein said layer of second and different material is deposited immediately after coating the metallic surfaces with the layer of first material.

15. The method of claim 1 wherein the relative thickness of the layer of a first material and a layer of a second and different material is such that a lead-rich alloy is produced by means of homogenization of the layers.

* * * * *